(12) United States Patent
Fujimoto et al.

(10) Patent No.: US 9,935,320 B2
(45) Date of Patent: Apr. 3, 2018

(54) COMPOSITE BODY, COLLECTOR MEMBER, GAS TANK, AND FUEL CELL DEVICE

(75) Inventors: Tetsurou Fujimoto, Kirishima (JP); Masahiko Higashi, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 900 days.

(21) Appl. No.: 13/580,639

(22) PCT Filed: Feb. 25, 2011

(86) PCT No.: PCT/JP2011/054378
§ 371 (c)(1),
(2), (4) Date: Aug. 22, 2012

(87) PCT Pub. No.: WO2011/105578
PCT Pub. Date: Sep. 1, 2011

(65) Prior Publication Data
US 2012/0315564 A1  Dec. 13, 2012

(30) Foreign Application Priority Data
Feb. 25, 2010   (JP) ................................ 2010-039957

(51) Int. Cl.
*H01M 8/02*      (2016.01)
*H01M 8/0217*    (2016.01)
(Continued)

(52) U.S. Cl.
CPC ........... *H01M 8/0217* (2013.01); *C22C 18/04* (2013.01); *C22C 19/05* (2013.01); *C22C 19/058* (2013.01);
(Continued)

(58) Field of Classification Search
None
See application file for complete search history.

(56) References Cited

U.S. PATENT DOCUMENTS 5,942,349 A     8/1999  Badwal et al. ................. 429/34
2006/0099442 A1  5/2006  Tietz et al.
(Continued)

FOREIGN PATENT DOCUMENTS

CA     2629878 A1    5/2007
CN     101300700 A  11/2008
(Continued)

OTHER PUBLICATIONS

Chinese language office action dated Sep. 3, 2013 and its English language concise explanation issued in corresponding Chinese application 201180008708.6.
(Continued)

*Primary Examiner* — Tracy Dove
(74) *Attorney, Agent, or Firm* — Volpe and Koenig, P.C.

(57) ABSTRACT

A composite body includes a substrate containing Cr; and a first composite oxide layer disposed on at least a part of a surface of the substrate, the first composite oxide layer having a spinel type crystal structure, a first largest content and a second largest content among constituent elements excluding oxygen of the first composite oxide layer being Zn and Al in random order. Accordingly, the composite body can suppress diffusion of Cr from the substrate containing Cr to the first composite oxide layer, and has improved long-term reliability. A collector member and a gas tank, each of which is formed of the composite body, can have improved long-term reliability. A fuel cell device having excellent long-term reliability can be obtained using the collector member and the gas tank.

7 Claims, 6 Drawing Sheets

(51) Int. Cl.
 C23C 28/00 (2006.01)
 H01M 8/0228 (2016.01)
 C22C 18/04 (2006.01)
 C22C 19/05 (2006.01)
 C22C 38/18 (2006.01)
 C23C 14/08 (2006.01)
 H01M 8/124 (2016.01)
(52) U.S. Cl.
 CPC .............. *C22C 38/18* (2013.01); *C23C 14/08* (2013.01); *C23C 28/345* (2013.01); *H01M 8/0228* (2013.01); *H01M 2008/1293* (2013.01)

(56) References Cited

U.S. PATENT DOCUMENTS

2008/0299417 A1 12/2008 Schuisky et al. ............... 429/12
2009/0035561 A1 2/2009 Gopanlan et al. ............ 428/336
2009/0297917 A1 12/2009 Higashi et al. ................. 429/34

FOREIGN PATENT DOCUMENTS

| JP | 9-142968 | 6/1997 |
| JP | 11-501764 | 2/1999 |
| JP | 2007-291412 | 11/2007 |
| JP | 2008-522363 | 6/2008 |
| WO | WO 2009/017841 A1 | 2/2009 |

OTHER PUBLICATIONS

Extended European search report dated Jan. 17, 2014 issued in corresponding European application 11747534.3.

Korean language office action dated May 20, 2014 and its English language concise explanation issued in corresponding Korean application 20127021178.

(A)

(B)

COMPOSITE BODY, COLLECTOR MEMBER, GAS TANK, AND FUEL CELL DEVICE

CROSS-REFERENCE TO THE RELATED APPLICATIONS

This application is a national stage of international application No. PCT/JP2011/054378, filed on Feb. 25, 2011 and claims the benefit of priority under 35 USC 119 to Japanese Patent Application No. 2010-039957, filed on Feb. 25, 2010, the entire contents of which are incorporated herein by reference.

TECHNICAL FIELD

The present invention relates to a composite body, a collector member, a gas tank, and a fuel cell device.

BACKGROUND ART

As a next-generation energy source, various fuel cell apparatuses generating power using hydrogen-containing gas and oxygen-containing gas have been proposed.

In general, such fuel cell apparatuses are configured to receive a fuel cell device, in which plurality of fuel cells are combined, in a housing and generate power by supplying fuel gas (hydrogen-containing gas) to a fuel electrode layer of each fuel cell and supplying air (oxygen-containing gas) to an air electrode layer. The plurality of fuel cells are electrically connected in series to each other with a felt-like or plate-like collector member interposed therebetween. Such a collector member is generally formed of a composite body with high workability and heat resistance and is formed of, for example, a Cr-containing alloy.

However, when the collector member is formed of the Cr-containing alloy, diffusion of Cr (hereinafter, also referred to as "Cr diffusion") from the alloy may be caused at the time of operating the fuel cell apparatus and there is thus a problem in that the heat resistance of the alloy decreases with the decrease in the amount of Cr contained in the alloy.

Therefore, in order to reduce the Cr diffusion, the use of a composite body in which the surface of the Cr-containing alloy is coated with a metal oxide film of Mn, Fe, Co, Ni, or the like has been proposed (see Patent Literature 1).

The use of a composite body in which a coating layer having a first layer containing Zn and a second layer, which is disposed on the first layer, containing ZnO and a metal element of which the valence is +3 or higher is provided to the surface of a Cr-containing alloy has been also proposed (see Patent Literature 2).

CITATION LIST

Patent Literature

Patent Literature 1: Japanese Unexamined Patent Publication JP-A 11-501764 (1999)
Patent Literature 2: Japanese Unexamined Patent Publication JP-A 2007-291412

SUMMARY OF INVENTION

Technical Problem

However, in the techniques described in Patent Literatures 1 and 2, the diffusion of Cr can be reduced to a certain extent due to the presence of the metal oxide film or the coating layer, but there is still a problem in that the amount of Cr diffused is great.

Solution to Problem

According to an aspect of the invention, there is provided a composite body, including: a substrate containing Cr; and a first composite oxide layer disposed on at least a part of a surface of the substrate, the first composite oxide layer having a spinel type crystal structure, a first largest content and a second largest content among constituent elements excluding oxygen of the first composite oxide layer being Zn and Al in random order.

It is preferable that the composite body further includes a second composite oxide layer disposed between the substrate and the first composite oxide layer, the second composite oxide layer having a spinel type crystal structure, a first largest content, a second largest content and a third largest content among constituent elements excluding oxygen of the second composite oxide layer being Zn, Cr and Mn in random order.

It is preferable that the composite body further includes a third composite oxide layer disposed on a surface of the first composite oxide layer, the third composite oxide layer having a spinel type crystal structure, a first largest content and a second largest content among constituent elements excluding oxygen of the third composite oxide layer being Zn and Mn in random order.

There is provided a collector member that electrically connects a plurality of fuel cells to each other, the collector member including: any one of the above-mentioned composite bodies, a surface of the first composite oxide layer, a zinc oxide layer, or the third composite oxide layer serving as a junction surface with the fuel cell.

There is provided a gas tank that supplies a reactant gas to a fuel cell, the gas tank including: any one of the above-mentioned composite bodies, the first composite oxide layer, the zinc oxide layer, or the third composite oxide layer being disposed on an outer surface side of the gas tank.

There is provided a fuel cell device, including: the above-mentioned collector member; and a plurality of fuel cells, the collector member being disposed between the plurality of fuel cells and electrically connecting the neighboring fuel cells to each other.

There is provided a fuel cell device, including: the above-mentioned gas tank; and a plurality of fuel cells fixed to the gas tank.

Advantageous Effect of Invention

According to the aspects of the invention, it is possible to suppress the diffusion of Cr from the substrate to the first composite oxide layer.

BRIEF DESCRIPTION OF DRAWINGS

FIG. 3(A) is a side view schematically illustrating the fuel cell device and FIG. 3(B) is a partially-enlarged plan view of a part surrounded with a dotted line in the fuel cell device shown in FIG. 3(A);

DESCRIPTION OF EMBODIMENTS

A collector member 20 which is an example of a composite body according to an embodiment will be described below with reference to FIGS. 1 and 2.

Figure 1:
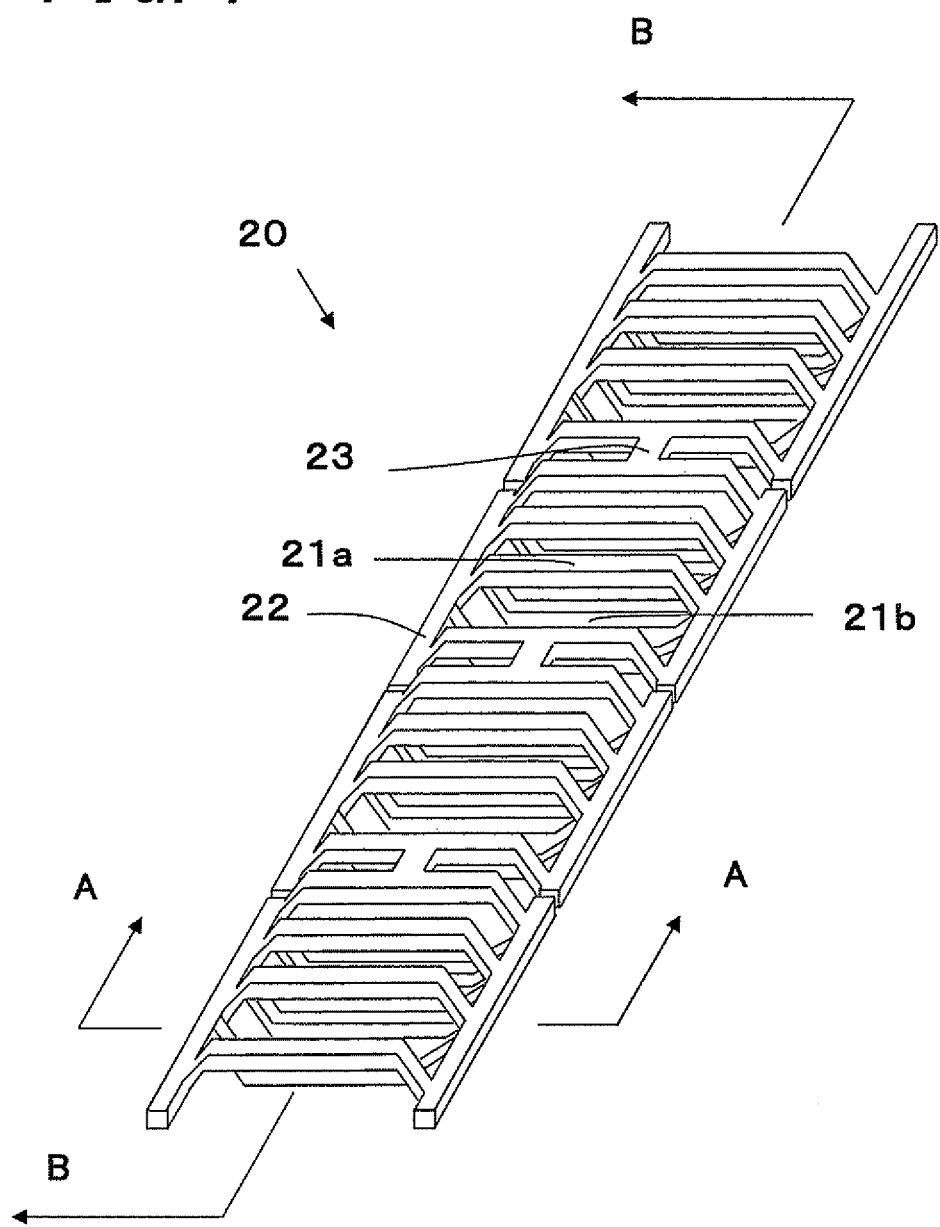
FIG. 1 is a perspective view illustrating an example of a collector member formed of a composite body according to an embodiment.

The collector member 20 shown in FIG. 1 is disposed between a plurality of fuel cells so as to electrically connect a plurality of neighboring fuel cells (not shown in FIGS. 1 and 2) and includes one junction portion 21a connected to one neighboring fuel cell, the other junction portion 21b connected to the other neighboring fuel cell, and a connection portion 22 connecting both ends of the pair of junction portions 21a and 21b as a basic structure of an electricity-collecting portion. More specifically, a plurality of strip-like junction portions 21a and 21b extending between the connection portions 22 laterally arranged are alternately curved relative to the connection portions 22 to form an electricity-collecting portion and a plurality of electricity-collecting portions are continuously formed in a longitudinal direction of the fuel cells with a conductive connection piece 23 interposed therebetween to form a single collector member 20.

Various fuel cell apparatuses are known as such a fuel cell apparatus and a solid oxide fuel cell apparatus is known as a fuel cell apparatus having a high power generation efficiency. The solid oxide fuel cell apparatus can enable the reduction in size of the fuel cell apparatus per unit power and can perform a load following operation following a varying load required for a household fuel cell apparatus.

Here, the solid oxide fuel cell apparatus is configured to receive a fuel cell device, in which a plurality of solid oxide fuel cells are combined, in a housing as described later, and generates power at a high temperature of 600° C. to 900° C. by supplying fuel gas (hydrogen-containing gas) to a fuel electrode layer of each solid oxide fuel cell and supplying air (oxygen-containing gas) to an air electrode layer thereof. Accordingly, the members such as the collector member 20 and a gas tank (not shown) that supplies reactant gas such as fuel gas to the fuel cells requires heat resistance and thus an alloy containing Cr is used as a substrate forming the members.

In order to reduce the Cr diffusion from the substrate 201 containing Cr, a coating layer 205 is formed on the substrate 201. The coating layer 205 is so configured that a second composite oxide layer 202 having a spinel type crystal structure, a first largest content, a second largest content, and a third largest content among constituent elements excluding oxygen of the second composite oxide layer 202 being Zn, Cr, and Mn in random order, a first composite oxide layer 203 having a spinel type crystal structure, a first largest content and a second largest content among the constituent elements excluding oxygen of the first composite oxide layer 203 being Zn and Al in random order, and a zinc oxide layer or a third composite oxide layer 204 having a spinel type crystal structure, a first largest content and a second largest content among constituent elements excluding oxygen of the third composite oxide layer 204 in random order are sequentially stacked on the substrate 201. In FIG. 1, the coating layer 205 includes three layers of the first composite oxide layer 203, the second composite oxide layer 202, and the third composite oxide layer 204, but is not limited to this structure as long as it includes at least the first composite oxide layer 203.

The constituent members of the collector member 20 shown in FIG. 2 will be described in detail below.

From the viewpoint of conductivity and heat resistance, the substrate 201 is preferably formed of an alloy containing two or more kinds of metal and is more preferably formed of an alloy containing Cr at 4 to 30 parts by weight with respect to 100 parts by weight of the alloy. Ni—Cr-based alloy or Fe—Cr-based alloy can be used as the composite body containing Cr and austenite-based stainless steel, ferrite-based stainless steel, and austenite-ferrite-based stainless steel can be used. The alloy may further contain Mn as another element.

The second composite oxide layer 202 includes a spinel type composite oxide, a first largest content, a second largest content, and a third largest content among constituent elements excluding oxygen thereof being Zn, Cr, and Mn in random order (hereinafter, also referred to as a Zn—Cr—Mn-based spinel). The Zn—Cr—Mn-based spinel has a spinel type crystal structure and includes a mixed phase of a Zn—Mn-based spinel and a Zn—Cr-based spinel or a Zn—Cr—Mn-based spinel. The elements of Zn, Cr, and Mn contained in the second composite oxide layer 202 are the first largest content, the second largest content, and the third largest content among the constituent elements excluding oxygen thereof in random order. The elements of Zn, Cr, and Mn contained in the second composite oxide layer 202 are preferably contained in the second composite oxide layer 202 in the range of 75 mol % to 95 mol % in total.

Examples of the Zn—Cr-based spinel include $ZnCr_2O_4$ and Zn—Cr-based spinel may contain elements such as Fe and Co. Examples of the Zn—Mn-based spinel include $ZnMn_2O_4$ as well as $Zn(Mn,Fe)_2O_4$ and $Zn(Mn, Co)_2O_4$ which contain elements such as Fe and Co. The second composite oxide layer 202 is also a layer effectively reducing the Cr diffusion.

The thickness of the second composite oxide layer 202 is preferably in the range of 0.1 μm to 5 μm, and more preferably in the range of 0.1 μm to 3 μm, from the viewpoint of reduction of the Cr diffusion and conductivity.

As the Cr diffusion from the substrate 201, two cases of a case where Cr is vaporized and diffused to the outside as gas (hereinafter, may also be referred to as vapor-phase diffusion) and a case where Cr is diffused to the outside as solid (hereinafter, may also be referred to as solid-phase diffusion) can be considered. Accordingly, in order to reduce the vapor-phase diffusion, it is preferable that the second composite oxide layer 202 is disposed on the overall surface of the substrate 201. In order to reduce the solid-phase diffusion, the second composite oxide layer 202 preferably has a relative density of 93% or more based on the Archimedes' principle and more preferably a relative density of 95% or more.

The first composite oxide layer 203 is stacked to cover the surface of the second composite oxide layer 202 and includes a spinel type composite oxide, a first largest content and a second largest content among constituent elements excluding oxygen thereof being Zn and Al in random order (hereinafter, may also be referred to as a Zn—Al-based spinel). The Zn—Al-based spinel can effectively reduce the Cr diffusion. Accordingly, it is possible to obtain a composite body with improved long-term reliability.

The elements of Zn and Al contained in the first composite oxide layer 203 are the first largest content and the second largest content among constituent elements excluding oxygen thereof in random order. The first composite oxide layer 203 is preferably formed of only the Zn—Al-based spinel, but the first composite oxide layer 203 may not be formed of only the Zn—Al-based spinel. In this case, it is possible to effectively reduce the Cr diffusion. The Zn—Al-based spinel is preferably contained at 50 mol % or more with respect to the total content of the first composite oxide layer 203 and more preferably at 70 mol % or more.

Examples of the Zn—Al-based spinel include $ZnAl_2O_4$. Another element may be solid-solved in the Zn—Al-based spinel. Examples of another element solid-solved in the Zn—Al-based spinel include Mn, Fe, and Co. By solid-solving at least one of Mn, Fe, and Co, it is possible to enhance the conductivity of the Zn—Al-based spinel. The Zn—Al-based spinel in which the elements are solid-solved can be expressed by $Zn(Al,Mn)_2O_4$, $Zn(Al,Fe)_2O_4$, and $Zn(Al, Co)_2O_4$.

When another element is solid-solved in the Zn—Al-based spinel, the elements constituting the particles of the spinel can be identified by taking an electron diffraction pattern of particles of the Zn—Al-based spinel through the use of a TEM and then referring to element map data of cations of a STEM-EDS. By analyzing and identifying the electron diffraction pattern, it can be confirmed that another element is solid-solved.

The thickness of the first composite oxide layer 203 is preferably in the range of 0.005 μm to 1 μm, from the viewpoint of conductivity and reduction of the Cr diffusion.

In this way, by combining the second composite oxide layer 202 and the first composite oxide layer 203 in this order, it is possible to further effectively suppress the Cr diffusion from the substrate 201.

The third composite oxide layer 204 is disposed so as to cover the surface of the first composite oxide layer 203, and includes a composite oxide having a spinel type crystal structure, a first largest content and a second largest content among constituent elements excluding oxygen thereof are Zn and Mn in random order. The elements of Zn and Mn contained in the third composite oxide layer 204 are the first largest content and the second largest content among constituent elements excluding oxygen thereof in random order. The total content of the elements of Zn and Mn contained in the third composite oxide layer 204 is preferably in the range of 50 mol % to 80 mol % with respect to the total amount of the third composite oxide layer. Examples of another element contained in the third composite oxide layer 204 include Fe, Co, and Al. These elements may be solid-solved in the Zn—Mn-based spinel or may be present as a composite oxide having a spinel type crystal structure.

The thickness of the third composite oxide layer 204 is preferably in the range of 0.1 μm to 5 μm and more preferably in the range of 0.1 μm to 3 μm, similarly to the second composite oxide layer 202.

A zinc oxide layer may be used instead of the third composite oxide layer 204. The zinc oxide layer may include an oxide containing metal such as Mn, Fe, Co, and Ni. The content of zinc oxide in the zinc oxide layer is preferably equal to or more than 70 mol % and more preferably equal to or more than 90 mol %.

Pure zinc oxide is an insulating material, but $Zn_{1+\delta}O$ is a cation-permeable n-type semiconductor, and becomes an n-type impurity semiconductor by an impurity element having a high valence being added. Here, since Zn in ZnO is a +2-valent ion, conductivity is given thereto by solid-solving a metal element becoming an ion of +3 valence or higher. Particularly, by solid-solving Fe or Al which is an ion of +3 valence or higher, conductivity can be given thereto.

Whether the coating layer 205 includes the first composite oxide layer 203, the second composite oxide layer 202, and the third composite oxide layer 204 or the zinc oxide layer can be determined as follows. That is, by cutting the coating layer 205 constituting the collector member 20, taking the electron diffraction pattern of the cut section through the use of a transmission electron microscope (TEM) using a nano-beam diffraction method or a limited field-of-view electron diffraction method, and analyzing the pattern, the crystal structure thereof is specified. The elements contained in the crystal structure can be determined through the use of the STEM-EDS and the compound can be identified on the basis of the contents of the determined elements. What contents of constituent elements excluding oxygen are contained in the respective layers can be determined as the result using the STEM-EDS.

The method of forming the coating layer 205 will be described below.

First, mixed powder in which ZnO powder and $Mn_2O_3$ powder are mixed at a mole ratio of 1:1, an aqueous binder, and a diluting agent are mixed to prepare a dipping solution for the second composite oxide layer 202 and the third composite oxide layer 204.

Then, ZnO powder and $Al_2O_3$ powder are combined at a mole ratio of 1:1, the combined powder (hereinafter, referred to as combined powder) is mixed, the mixed powder is fired at a temperature of 1050° C. for 2 hours to prepare a Zn—Al-based spinel, and the resultant is pulverized to obtain powder of the Zn—Al-based spinel. This powder, an acryl-based binder, a diluting agent, and a dispersion medium are combined to prepare a dipping solution for the first composite oxide layer 203.

For the zinc oxide layer, ZnO in which 3 mass % Al is solid-solved is pulverized to obtain ZnO powder in which 3 mass % Al is solid-solved. The ZnO powder, an acryl-based binder, a diluting agent, and a dispersion medium are combined to prepare a dipping solution for the zinc oxide layer.

Thereafter, the substrate 201 containing Cr is dipped in the dipping solution for the second composite oxide layer 202 to coat the overall surface of the substrate 201 with the dipping solution, and the resultant is dried and baked. For the first composite oxide layer 203 and the third composite oxide layer 204 or the zinc oxide layer, the coating layer 205 is formed using the same method.

In another method of forming the coating layer 205, first, ZnO powder and $Mn_2O_3$ powder are combined at a mole ratio of 1:1, the combined powder (hereinafter, referred to as combined powder) is mixed, and the mixed powder is fired at a temperature of 1050° C. for 2 hours to prepare a sintered compact of the Zn—Mn-based spinel, whereby a sputtering target for the second composite oxide layer 202 and the third composite oxide layer 204 is prepared.

Then, ZnO powder and $Al_2O_3$ powder are combined at a mole ratio of 1:1, the combined powder (hereinafter, referred to as combined powder) is mixed, and the mixed powder is fired at a temperature of 1050° C. for 2 hours to prepare a sintered compact of the Zn—Al-based spinel, whereby a sputtering target for the first composite oxide layer 203 is prepared.

For the zinc oxide layer, ZnO powder and $Al_2O_3$ powder with a content of 3 mass % with respect to ZnO are combined, the combined powder (hereinafter, referred to as combined powder) are mixed, and the mixed powder is fired at a temperature of 1500° C. for 2 hours to prepare a sintered compact of ZnO in which Al was solid-solved, whereby a sputtering target for the zinc oxide layer is prepared.

By sequentially forming the second composite oxide layer 202, the first composite oxide layer 203, and the third composite oxide layer 204 or the zinc oxide layer on the substrate 201, the coating layer 205 can be formed.

In another method of forming the coating layer 205, by performing a sputtering process on the surface of the substrate 201 formed of Cr alloy containing at least Mn using a sintered compact of ZnO in which 3 mass % Al with respect to the total amount is solid-solved as a sputtering target and then performing a heating (baking) process thereon at a temperature of 750° C., the coating layer 205 including the second composite oxide layer 202, the first composite oxide layer 203, and the third composite oxide layer 204 or the zinc oxide layer can be formed on the substrate 201.

Figure 2:
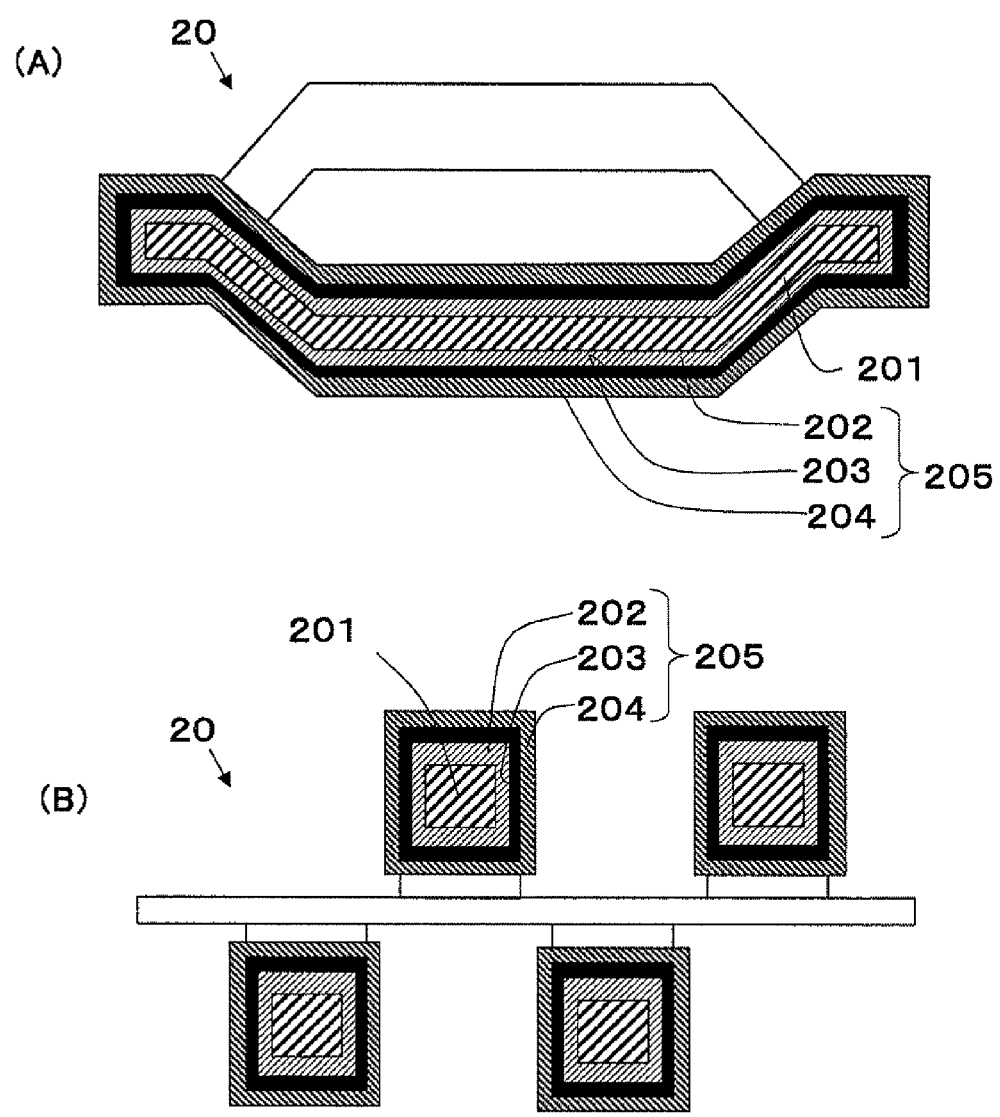
FIG. 2(A) is an enlarged cross-sectional view taken along the line A-A of the collector member shown in FIG. 1
FIG. 2(B) is a partially-enlarged cross-sectional view taken along the line B-B of the collector member shown in FIG. 1.

The shape of the collector member 20 is not limited to the shape shown in FIGS. 1 and 2. For example, a cylindrical shape, a mesh shape, or a shape obtained by processing a plate-like member in a comb shape and alternately curving the neighboring teeth to the opposite sides may be used.

A fuel cell device 30 according to the invention will be described below with reference to FIGS. 3 and 4.

In the fuel cell device 30 (hereinafter, also referred to as a cell stack device 30), a fuel electrode layer 2 as an inner electrode layer, a solid electrolyte layer 3, and an air electrode layer 4 as an outer electrode layer are sequentially stacked on one flat surface of a pillar-like conductive support 10 having a pair of flat surfaces and including gas flow channels 16 (six gas flow channels are disposed in the fuel cell 1 shown in FIG. 3) causing reactant gas (fuel gas) to flow therein. An interconnector 5 is stacked on the other flat surface. A plurality of pillar-like (hollow plate-like) fuel cells 1 are disposed upright. The collector member 20 is disposed between the neighboring fuel cells 1 and electrically connects the fuel cells to form a cell stack 31, and the lower ends of the fuel cells 1 are fixed to a gas tank 34 supplying reactant gas (fuel gas) to the fuel cells 1.

The cell stack device 30 includes elastically-deformable conductive members 32 of which bottom ends are fixed to the gas tank 34 so as to interpose the cell stack 31 between both ends in the arrangement direction of the fuel cells 1 with end collector members 24 therebetween. The bottom ends of the fuel cells 1 and the bottom ends of the conductive members 32 are fixed to the gas tank 34 with, for example, an adhesive (such as a glass sealing material). The gas flow channels 16 disposed in the support 10 communicate with a fuel gas chamber (not shown) of the gas tank 34.

Figure 4:
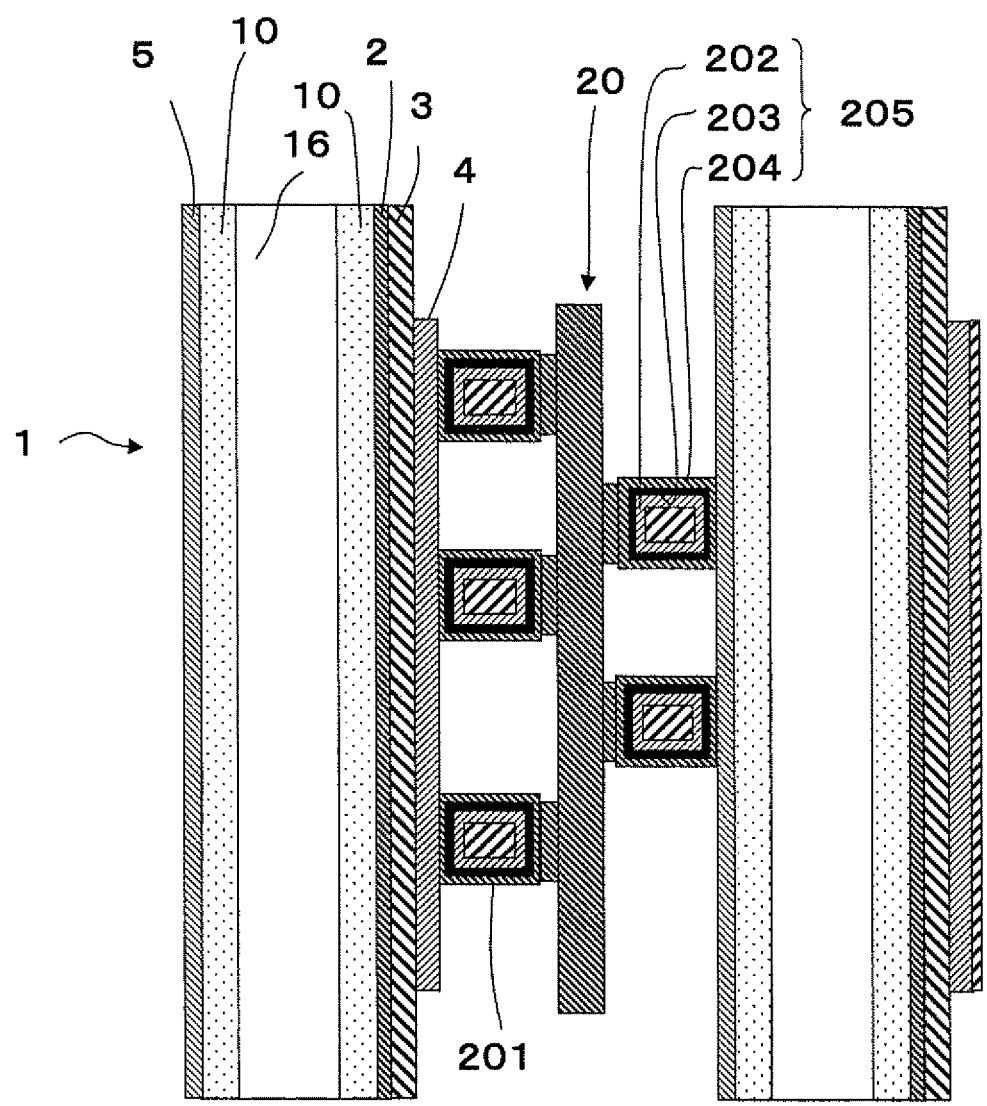
FIG. 4 is a partially-enlarged longitudinal cross-sectional view of the fuel cell device formed of the composite body according to the embodiment.

As shown in FIG. 4, the collector members 20 and the fuel cells 1 are bonded to electrically connect the plurality of fuel cells 1 in series, and the surface of the coating layer 205 disposed in each collector member 20 serves as a junction surface bonded to the corresponding fuel cell 1.

The fuel cell 1 and the collector member 20 may be bonded to each other with a conductive adhesive (not shown). Accordingly, the contact therebetween is an ohmic contact and the potential drop is reduced, thereby effectively preventing the decrease in electricity-collecting performance.

The fuel cell 1 may have a configuration in which the support 10 is also used as the fuel electrode layer 2, the solid electrolyte layer 3 and the air electrode layer 4 are sequentially stacked on one surface thereof, and the interconnector 5 is stacked on the other surface thereof. The members constituting the fuel cell 1 can be generally formed of known materials.

In the below description, an inner electrode layer is the fuel electrode layer 2 and an outer electrode layer is the air electrode layer 4, so long as it is not particularly specified. The end collector member 24 may have the same configuration as the collector member 20 or may have a configuration different from the collector member 20. The end collector member 24 is preferably provided with the above-mentioned coating layer 205.

Figure 3:
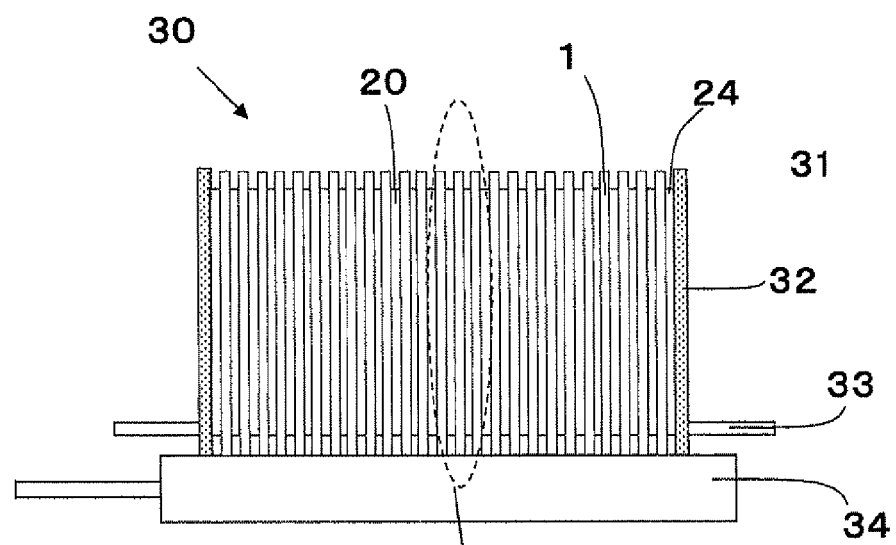
FIG. 3 is a diagram illustrating an example of a fuel cell device formed of the composite body according to the embodiment, where
Figure 3:
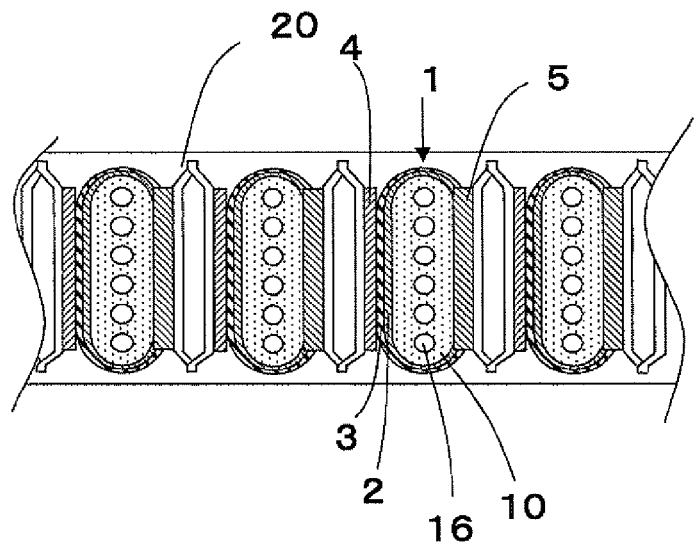

In the conductive member 32 shown in FIG. 3, a current drawing portion 33 drawing out current generated through the power generation of the cell stack 31 is disposed in a shape extending to the outside along the arrangement direction of the fuel cells 1. Since the conductive member 32 can be formed of the above-mentioned composite body similarly to the collector member 20, it is preferable that the conductive member 32 is provided with the above-mentioned coating layer 205. Accordingly, it is possible to reduce the Cr diffusion.

In this way, by forming the collector member 20 or the conductive member 32 by the composite body in which the coating layer 205 containing the Zn—Al-based spinel is disposed, it is possible to reduce the Cr diffusion. As a result, it is possible to reduce Cr poisoning in which electric resistance increases to degrade the power generation performance of the fuel cell 1 due to the diffusion of Cr into the air electrode layer 4 of the fuel cell 1 or the interface between the air electrode layer 4 and the solid electrolyte layer 3.

In order to enhance the workability and the heat resistance and to reduce an influence on the fuel cells 1 or the adhesive material, the gas tank 34 is formed of the composite body containing Cr and the first composite oxide layer 203 including the Zn—Al-based spinel is disposed on the outer surface thereof. Accordingly, it is possible to reduce the Cr diffusion.

Here, the inside of the housing receiving the cell stack device 30 is in an oxidation atmosphere by supplying oxygen-containing gas (such as air) to the inside of the housing. Cr contained in the substrate 201 is oxidized in the oxidation atmosphere and a chromium oxide film may be formed on the outer surface of the gas tank 34 when the fuel cell apparatus operates at high temperatures. Particularly, the outer surface (the upper part) of the gas tank 34 located in the vicinity of the fuel cells 1 is exposed to the high-temperature oxidation atmosphere and the chromium oxide film can be easily formed. When the chromium oxide film is formed, volatilization of Cr vapor (so-called Cr volatilization) may be caused.

Here, when Cr in the fuel cells 1 is volatilized and the volatilized Cr reaches the air electrode layer 4 or the interface between the air electrode layer 4 and the solid electrolyte layer 3, the Cr poisoning may be caused to raise the electric resistance, thereby degrading the power generation performance of the fuel cells 1.

Accordingly, by forming the gas tank 34 out of the composite body having the coating layer 205 in which the second composite oxide layer 202, the first composite oxide layer 203, and the third composite oxide layer 204 are sequentially stacked on the outer surface of the substrate containing Cr, it is possible to reduce the Cr diffusion and to suppress the formation of the chromium oxide film on the surface of the gas tank 34. In the gas tank 34, it is preferable that the coating layer 205 is disposed on the outer surface of the top of the substrate containing Cr and it is more preferable that the coating layer 205 is disposed so as to cover the outer surface of the substrate containing Cr.

In the above-mentioned example, the fuel gas as reactant gas flows in the gas tank 34 and the oxygen-containing gas flows to the outside of the fuel cells 1. However, each fuel cell 1 may have a configuration in which the air electrode layer 4, the solid electrolyte layer 3, and the fuel electrode layer 2 are sequentially stacked on one flat surface of the support 10, the oxygen-containing gas flows in the gas tank 34, and the fuel gas flows to the outside of the fuel cell 1. In this case, since the surface of the gas tank 34 exposed to the oxidation atmosphere is the inner surface of the gas tank 34, it is preferable that the second composite oxide layer 202, the first composite oxide layer 203, and the third composite oxide layer 204 are disposed on the inner surface of the gas tank 34 in this order.

The outer surface of the gas tank 34 means the surface facing the outside of the gas tank 34, and the inner surface of the gas tank 34 means the surface facing the inside of the gas tank.

Since a solid oxide fuel cell apparatus which is a kind of a fuel cell apparatus generates power under a high-temperature condition of about 600° C. to 900° C., the temperature in the housing is very high. Accordingly, for example, when a housing body, a reformer received in the housing, and the like are formed of a substrate containing Cr in consideration of heat resistance, the members may be formed of the composite body according to the invention. As a result, it is possible to reduce the Cr poisoning of a solid oxide fuel cell.

An example where the inner surface of the gas tank 34 causing fuel gas to flow in the gas flow channels 16 of the fuel cells 1 is formed by coating the surface of a substrate containing Cr with the second composite oxide layer 202, the first composite oxide layer 203, and the third composite oxide layer 204 in this order, that is, an example where the inner surface of the gas tank 34 is in a reduction atmosphere, will be described below. In this case, although the reason is not clear, it can be considered that the Zn—Mn-based spinel in the second composite oxide layer 202 and the third composite oxide layer 204 or the Zn—Al-based spinel in the first composite oxide layer 203 is decomposed due to the reduction atmosphere to form a compound of metal containing Zn. The Zn-containing metal compound migrates from the inside of the gas tank 34 to ends of the fuel cells 1 via the gas flow channels 16 and is oxidized by the oxygen-containing gas in the vicinity of the ends of the fuel cells 1. Accordingly, an oxide of metal containing Zn may be precipitated in the vicinity of the outlets of the gas flow channels 16 to clog the gas flow channels 16 in the vicinity of the end of the fuel cell 1. Therefore, it is preferable that the coating layer 205 is not disposed on the surface exposed to the reduction atmosphere. In this case, since Cr is not oxidized in the reduction atmosphere, a film of chromium oxide is not formed on the surface of the substrate containing Cr and thus volatilization of Cr vapor does not occur.

Figure 5:
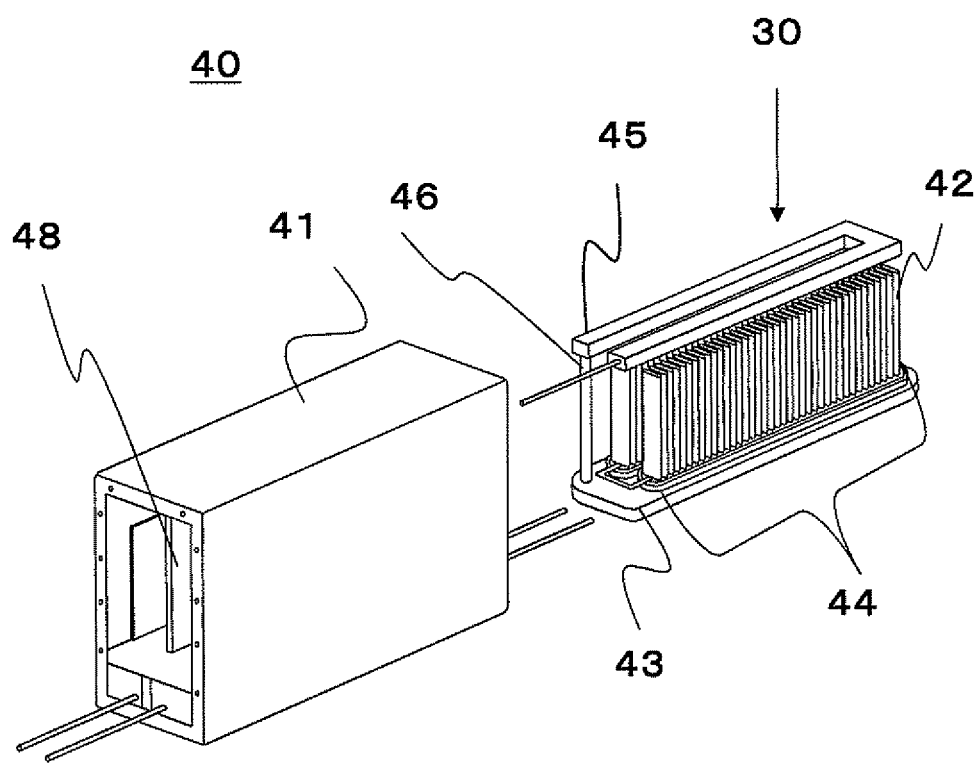
FIG. 5 is a perspective view illustrating the appearance of a fuel cell module receiving the fuel cell device shown in FIG. 4.

FIG. 5 is a perspective view illustrating the appearance of a fuel cell module 40 receiving the fuel cell device 30 which is an example of this embodiment.

In FIG. 5, the fuel cell module 40 is configured by receiving in a rectangular housing 41a cell stack device 30 in which fuel cells 42 having gas flow channels (not shown) through which fuel gas flows are arranged upright, the neighboring fuel cells 42 are electrically connected in series to each other with a collector member (not shown) interposed therebetween to form a cell stack 44, and the bottom ends of the fuel cells 42 are fixed to a gas tank 43 with an insulating adhesive (not shown) such as a glass sealing material.

In FIG. 5, in order to acquire fuel gas to be used in the fuel cells 42, a reformer 45 for reforming a raw material such as natural gas or kerosene to generate fuel gas is disposed above the cell stack 44. The fuel gas generated by the reformer 45 is supplied to the gas tank 43 via a gas flow pipe 46 and is supplied to the fuel gas flow channels 16 formed in the fuel cells 42 via the gas tank 43.

FIG. 5 shows a state where parts (front and rear walls) of the housing 41 are removed and the cell stack device 30 and the reformer 45 received therein are pulled out backward. Here, in the fuel cell module 40 shown in FIG. 5, the cell stack device 30 can be made to slide and can be received in the housing 41. The cell stack device 30 may include the reformer 45.

In FIG. 5, an oxygen-containing gas introducing member 48 installed in the housing 41 is disposed between the gas tank 43 and the cell stack 44 disposed thereon and supplies oxygen-containing gas (air) to the lower ends of the fuel cells 42 so that the oxygen-containing gas flows to the side of the fuel cells 42 from the lower ends to the upper ends in synchronization with the flow of the fuel gas. By combusting the fuel gas discharged from the gas flow channels 16 of the fuel cells 42 and the oxygen-containing gas at the upper ends of the fuel cells 42, it is possible to raise the temperature of the fuel cells 42 and to accelerate the startup of the cell stack device 30. By combusting the fuel gas discharged from the gas flow channels 16 of the fuel cells 42 and the oxygen-containing gas at the upper ends of the fuel cells 42 in a longitudinal direction thereof, it is possible to warm the reformer 45 disposed above the fuel cells 42 (the cell stack 44). Accordingly, the reformer 45 can efficiently perform a reforming reaction.

Figure 6:
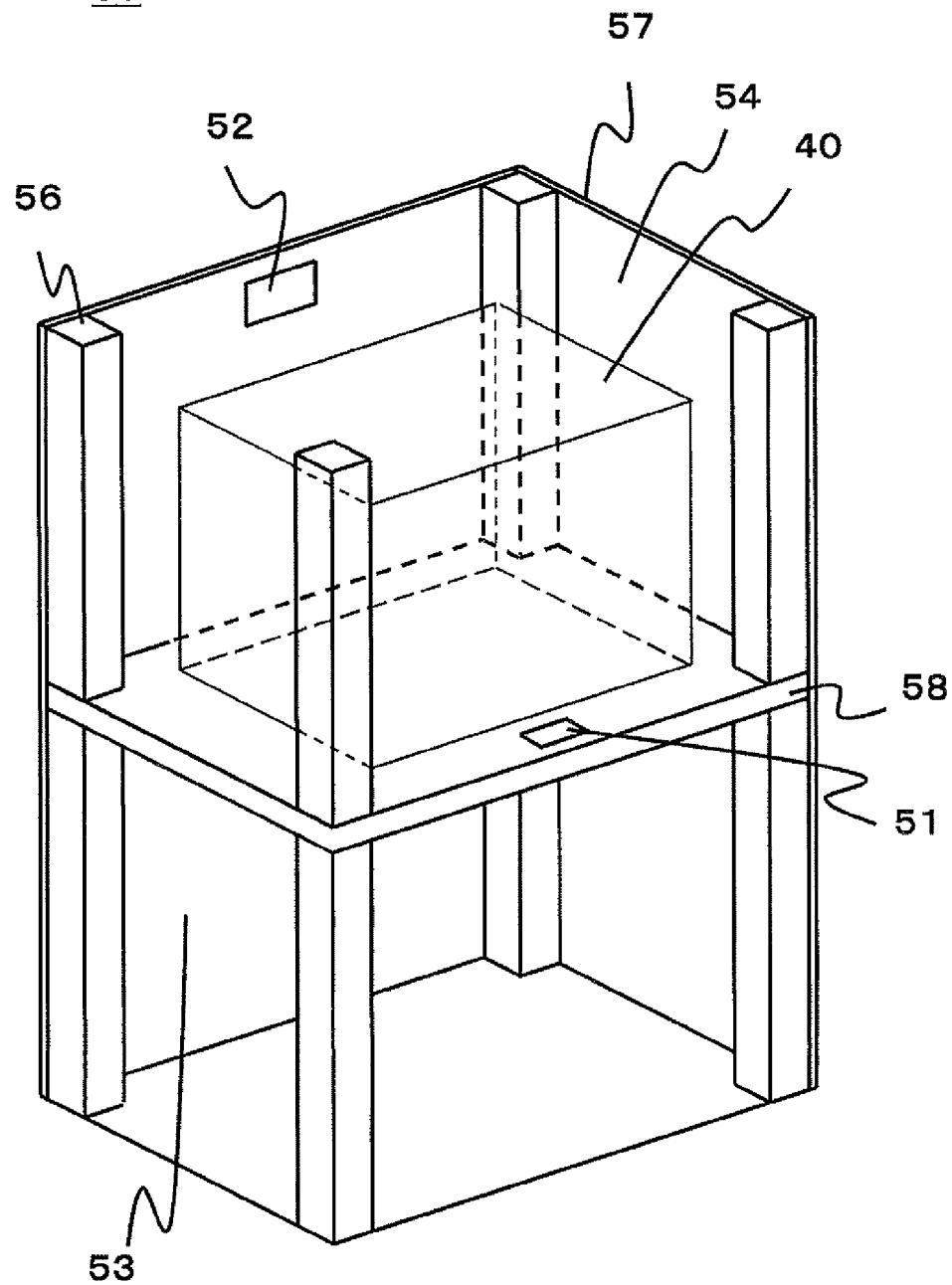
FIG. 6 is an exploded perspective view illustrating a fuel cell apparatus in which the fuel cell module shown in FIG. 5 is received in an exterior case.

FIG. 6 is an exploded perspective view illustrating a fuel cell apparatus 50 according to the invention in which the fuel cell module 40 shown in FIG. 5 is received in an exterior case. Some parts are not shown in FIG. 6.

In the fuel cell apparatus 50 shown in FIG. 6, an exterior case including columns 56 and exterior plates 57 is partitioned vertically by a partition plate 58, the upside space is defined as a module receiving chamber 54 receiving the fuel cell module 40, and the downside space is defined as an auxiliary machine receiving chamber 53 receiving auxiliary machines used to operate the fuel cell module 40. The auxiliary machines received in the auxiliary machine receiving chamber 53 are not shown.

An air flow port 51 allowing air of the auxiliary machine receiving chamber 53 to flow into the module receiving chamber 54 is disposed in the partition plate 58 and an exhaust port 52 exhausting air in the module receiving chamber 54 is disposed in a part of an exterior plate 57 constituting the module receiving chamber 54.

In the fuel cell unit 50, since the fuel cell module 40 which can improve long-term reliability is received in the module receiving chamber 54 as described above, it is possible to provide a fuel cell unit with improved long-term reliability.

While the invention has been described in detail, the invention is not limited to the above-mentioned embodiment but may be modified and improved in various forms without departing from the gist of the invention.

For example, the composite body according to the invention is not limited to the solid oxide fuel cell apparatus, but can be used for various members such as the housing used under high-temperature conditions. For example, the composite body can be effectively used for a molten carbonate fuel cell apparatus generating power at a temperature of 600° C. to 700° C. as another fuel cell apparatus.

When the conductive adhesive is provided, a bonding layer (not shown) formed of the same material as the conductive adhesive may be disposed on the coating layer 205 in order to enhance the adhesion between the conductive adhesive and the coating layer 205. Specifically, $LaFeO_3$-based or $LaMnO_3$-based perovskite oxides can be used.

The example where the second composite oxide layer 202 is provided has been described, but the first composite oxide layer 203 including the Zn—Al-based spinel may be disposed directly on the substrate 201 without forming the second composite oxide layer 202. In this case, it is also possible to suppress the Cr diffusion.

EXAMPLES

A test for checking the effect on the diffusion of Cr was carried out.

First, material powder of the Zn—Al-based spinel of the first composite oxide layer shown in Table 1 was prepared.

For Sample Nos. 2, 3 and 11, ZnO powder and $Al_2O_3$ powder were combined at a mole ratio of 1:1, the combined powder (hereinafter, referred to as combined powder) was shaped, and the resultant was fired at a temperature of 1050° C. for 2 hours, whereby a sputtering target including the Zn—Al-based spinel was prepared. The sintered body was pulverized again to obtain powder of the Zn—Al-based spinel for Sample Nos. 4 and 10.

For Sample Nos. 5 to 9, 12 and 13, $Al_2O_3$ powder was combined into ZnO powder by 3 mass % with respect to the total weight, the combined powder was shaped, and the resultant was fired at a temperature of 1050° C. for 2 hours, whereby a sputtering target formed of the ZnO sintered body in which 3 mass % of Al was solid-solved was prepared. The sintered body was pulverized again to obtain ZnO powder in which 3 mass % of Al was solid-solved for Sample No. 14.

For Sample Nos. 2 and 11, ZnO powder and $Mn_2O_3$ powder were combined at a mole ratio of 1:1, the combined powder (hereinafter, referred to as combined powder) was shaped, and the resultant was fired at a temperature of 1050° C. for 2 hours, whereby a sputtering target formed of the sintered body of the Zn—Mn-based spinel was prepared. The sintered body was pulverized again to obtain powder of the Zn—Mn-based spinel.

The $Mn_2O_3$ powder for Sample No. 1, the ZnO powder in which 3 mass % of Al is solid-solved, the powder of the Zn—Mn-based spinel, and the powder of the Zn—Al-based spinel were pulverized in an average particle diameter of 0.5 µm through the use of a ball mill, the pulverized powder, an acryl-based binder, mineral spirits as a diluting agent, and an DBP as a dispersion medium were combined to prepare respective dipping solutions.

Thereafter, the respective layers were formed on alloys formed of Fe—Cr-based heat-resistance alloy plates (containing 75 mass % of Fe and Cr, Mn, and Ni as the balance) with a thickness of 0.4 mm, a length of 20 mm, and a width of 20 mm through the use of a sputtering method.

When the respective layers are formed through the use of a dipping method, the alloys were dipped in the dipping solutions of the layers for the samples to apply the dipping solution onto the overall surfaces of the alloys. Thereafter, the resultants were dried at 130° C. for 1 hour, were subjected to a binder removing process at 500° C. for 2 hours, and then were baked in a furnace at 950° C. to 1050° C. for 2 hours.

In order to prepare Sample No. 14, the alloy was dipped in a ZnO dipping solution in which 3 mass % of Al was solid-solved to apply the dipping solution onto the overall surface of the alloy with a thickness of 10 µm. Thereafter, the resultant was dried at 130° C. for 1 hour, was subjected to a binder removing process at 500° C. for 2 hours, and then was baked in a furnace at 950° C. to 1050° C. for 2 hours, whereby a sample was prepared.

For Sample Nos. 5 to 9, 12 and 13, a ZnO layer in which 3 mass % of Al was solid-solved was formed with a thickness of 2 µm on the surface of the alloy containing Cr through the use of a sputtering method using the ZnO sputtering target in which 3 mass % of Al was solid-solved in the alloy. Thereafter, the resultant was subjected to heat treatment of 750° C. to form the layers shown in Table 1.

The alloy having the coating layer disposed thereon was dipped in a slurry obtained by adding LaSrCoFe powder with an average particle diameter of 0.5 µm, an acryl-based binder, and a glycol-based solvent to provide a conductive adhesive (LaSrCoFe layer) with a thickness of 15 µm on the surface of the coating layer and the resultant was baked at the same temperature, whereby test pieces were prepared.

After the test pieces were subjected to power generation for 100 hours, the cross-sections of the conductive adhesive were checked through the use of an EPMA (Electron Probe X-ray Micro Analyzer). In the analysis using the EPMA, JXA-8100 made by JEOL Ltd. was used and an applied voltage of 15 kV, a probe current of $2.0 \times 10^{-7}$ A, and an analysis area of 50 µm×50 µm were set as the measurement conditions. The dispersive crystal was set to LiF. The content of Cr was measured at a position apart by 10 µm from the interface between the first composite oxide layer and the conductive adhesive toward the conductive adhesive and the results are described in Table 1.

The conductive adhesive (LSCF layer) easily reacts with Cr to form a reaction product. Accordingly, when Cr diffuses into the conductive adhesive, a reaction product of the conductive adhesive and Cr is formed. Accordingly, by calculating the content of Cr (mass %) in the cross-section of the conductive adhesive, the diffusion of Cr can be determined.

Zn—Mn in Table 1 represents the Zn—Mn-based spinel, Zn—Al in Table 1 represents the Zn—Al-based spinel, the ZnO in Table 1 represents ZnO in which 3 mass % of Al is solid-solved.

TABLE 1

| Sample No. | Second composite oxide layer | | First composite oxide layer | | Third composite oxide layer | | Cr in conductive adhesive (mass %) |
|---|---|---|---|---|---|---|---|
| | Formation of second composite oxide layer | Composition of second composite oxide layer | Formation of first composite oxide layer | Composition of first composite oxide layer | Formation of third composite oxide layer | Composition of third composite oxide layer | |
| *1 | Sputtering of $Mn_2O_3$ | $Mn_2O_3$ | — | — | — | — | 15 |
| 2 | Sputtering of Zn—Mn | Zn—Mn | Sputtering of Zn—Al | Zn—Al | — | — | 3 |

TABLE 1-continued

| | Second composite oxide layer | | First composite oxide layer | | Third composite oxide layer | | Cr in |
| --- | --- | --- | --- | --- | --- | --- | --- |
| Sample No. | Formation of second composite oxide layer | Composition of second composite oxide layer | Formation of first composite oxide layer | Composition of first composite oxide layer | Formation of third composite oxide layer | Composition of third composite oxide layer | conductive adhesive (mass %) |
| 3 | — | — | Sputtering of Zn—Al | Zn—Al | Sputtering of ZnO | ZnO | 4 |
| 4 | Dipping of ZnO | ZnO | Dipping of Zn—Al | Zn—Al | — | — | 4 |
| 5 | Sputtering of ZnO | ZnO | Sputtering of ZnO | Zn—Al and Zn—Mn | Sputtering of ZnO | ZnO | 5 |
| 6 | Sputtering of ZnO | Zn—Mn | Sputtering of ZnO | Zn—Al and Zn—Mn | Sputtering of ZnO | ZnO | 3 |
| 7 | Sputtering of ZnO | ZnO | Sputtering of ZnO | Zn—Al | Sputtering of ZnO | Zn—Mn | 1 |
| 8 | Sputtering of ZnO | ZnO | Sputtering of ZnO | Zn—Al | Sputtering of ZnO | ZnO | 3 |
| 9 | Sputtering of ZnO | Zn—Mn | Sputtering of ZnO | Zn—Al | Sputtering of ZnO | ZnO | 1 |
| 10 | Dipping of ZnO | Zn—Mn | Dipping of Zn—Al | Zn—Al | Dipping of ZnO | Zn—Mn | 0 |
| 11 | Sputtering of Zn—Mn | Zn—Mn | Sputtering of Zn—Al | Zn—Al | Sputtering of Zn—Mn | Zn—Mn | 0 |
| 12 | Sputtering of ZnO | Zn—Mn | Sputtering of ZnO | Zn—Al | Dipping of ZnO | Zn—Mn | 0 |
| 13 | Sputtering of ZnO | Zn—Mn | Sputtering of ZnO | Zn—Al | Sputtering of ZnO | Zn—Mn | 0 |
| *14 | Dipping of ZnO | ZnO | Dipping of ZnO | ZnO | Dipping of ZnO | ZnO | 10 |

*represents beyond the scope of the invention.

As seen from the results of Table 1, in Sample No. 1 in which the surface of the alloy containing Cr is covered with only the $Mn_2O_3$ layer, the content of Cr was 15 mass %. On the contrary, in Sample Nos. 2 to 13 in which the Zn—Al-based spinel was present, it could be seen that the content of Cr was equal to or less than 5 mass % and the Cr diffusion could be effectively reduced.

In Sample No. 7 in which the first composite oxide layer was formed of the Zn—Al-based spinel, the content of Cr was smaller by 4 mass % than that in Sample No. 5 in which the first composite oxide layer was formed of the Zn—Al-based spinel and the Zn—Mn-based spinel and thus it could be seen that it was possible to further reduce the Cr diffusion by forming the first composite oxide layer out of the Zn—Al-based spinel.

In Sample No. 9, the content of Cr was smaller by 3 mass % than that in Sample No. 3 in which the second composite oxide layer was not formed, and thus it could be seen that it was possible to further suppress the Cr diffusion by forming the second composite oxide layer.

In Sample No. 9, the content of Cr was smaller by 2 mass % than that in Sample No. 2 in which the third composite oxide layer was not formed, and thus it could be seen that it was possible to further suppress the Cr diffusion by forming the third composite oxide layer.

In Sample No. 13, the content of Cr was smaller by 3 mass % than that in Sample No. 8 in which the second composite oxide layer and the third composite oxide layer were formed of the ZnO in which 3 mass % of Al was solid-solved, and thus it could be seen that it was possible to further suppress the Cr diffusion by forming the second composite oxide layer and the third composite oxide layer out of the Zn—Mn-based spinel.

In Sample No. 11 in which the second composite oxide layer and the third composite oxide layer were prepared through the sputtering of the Zn—Mn-based spinel and the first composite oxide layer was prepared through the sputtering of the Zn—Al-based spinel, the Cr diffusion did not occur.

In Sample No. 14 which was formed through the clipping of ZnO in which 3 mass % of Al was solid-solved, the Zn—Al-based spinel was not formed. Although not clear, it is considered that the reason is that ZnO was not formed uniform on the surface of the substrate when the coating layer was formed through the dipping.

In Sample Nos. 10 to 13, the second composite oxide layer was formed of the Zn—Mn-based spinel, the first composite oxide layer was formed of the Zn—Al-based spinel, the third composite oxide layer was formed of the Zn—Mn-based spinel, and Cr did not diffuse in the conductive adhesive.

REFERENCE SIGNS LIST

1: Fuel cell
20: Collector member
201: Substrate
202: Second composite oxide layer
203: First composite oxide layer
204: Third composite oxide layer
205: Coating layer
30: Fuel cell device
31: Cell stack
34: Gas tank
40: Fuel cell module
50: Fuel cell apparatus

The invention claimed is:

1. A composite body, comprising:
   a substrate containing Cr; and
   a coating layer disposed on at least part of a surface of the substrate and comprising a first composite oxide layer comprising $ZnAl_2O_4$, wherein the $ZnAl_2O_4$ is at 50 mol % or more with respect to the total content of the first composite oxide layer.

2. A collector member that electrically connects a plurality of fuel cells to each other, the collector member comprising:
   the composite body according to claim 1,
   a surface of the first composite oxide layer serving as a junction surface with the fuel cell.

3. A gas tank that supplies a reactant gas to a fuel cell, the gas tank comprising:
   the composite body according to claim 1,
   the first composite oxide layer being disposed on an outer surface side of the gas tank.

4. A fuel cell device, comprising:
   the collector member according to claim 2; and
   a plurality of fuel cells,
   the collector member being disposed between the plurality of fuel cells and electrically connecting the neighboring fuel cells to each other.

5. A fuel cell device, comprising:
the gas tank according to claim 3 and
a plurality of fuel cells fixed to the gas tank.

6. A composite body, comprising:
a substrate containing Cr;
a second composite oxide layer disposed on at least part of the surface of the substrate and comprising a Zn—Mn based spinel type crystal; and
a first composite oxide layer disposed on at least a part of the second composite oxide layer and comprising $ZnAl_2O_4$, wherein the $ZnAl_2O_4$ is at 50 mol % or more with respect to the total content of the first composite oxide layer.

7. A composite body according to claim 1, further comprising:
a third composite oxide layer covering the first composite oxide layer,
wherein the third composite oxide layer comprises a Zn—Mn-based spinel, a first largest content and a second largest content among constituent elements excluding oxygen thereof are Zn and Mn in random order, the Zn—Mn-based spinel being contained in the range of 50 mol % to 80 mol % with respect to the total content of the third composite oxide layer.

* * * * *